United States Patent [19]

Schaaf et al.

[11] Patent Number: 4,720,741

[45] Date of Patent: Jan. 19, 1988

[54] ANTISTATIC AND ANTITACK COATING FOR CIRCUIT DEVICES

[75] Inventors: Theodore F. Schaaf; Ching-Ping Wong, both of Lawrence Township, Mercer County, N.J.

[73] Assignee: American Telephone and Telegraph Company, AT&T Technologies, Inc., Berkeley Heights, N.J.

[21] Appl. No.: 878,717

[22] Filed: Jun. 26, 1986

[51] Int. Cl.[4] ............... H01L 23/30; H01L 23/06
[52] U.S. Cl. ............................. 357/72; 357/73; 357/61
[58] Field of Search ............... 357/72, 73, 61, 67

[56] References Cited

U.S. PATENT DOCUMENTS

| | | | |
|---|---|---|---|
| 3,206,647 | 9/1965 | Kahn | 357/72 |
| 3,325,586 | 6/1967 | Suddick | 357/72 |
| 3,496,427 | 2/1970 | Lee | 357/72 |

Primary Examiner—Martin H. Edlow
Assistant Examiner—S. V. Clark
Attorney, Agent, or Firm—Roderick B. Anderson; Joel F. Spivak

[57] ABSTRACT

In an electronic device assembly comprising at least one circuit element and an encapsulant therefor, wherein the encapsulant comprises a silicone resin characterized in that subsequent to the curing of said encapsulant, the resin is coated with a fine inorganic powder such as fumed or fused silica which essentially eliminates static charge and tackiness of the surface.

6 Claims, 2 Drawing Figures

CONTROL SIP

SILICA TREATED SIP

ANTISTATIC AND ANTITACK COATING FOR CIRCUIT DEVICES

TECHNICAL FIELD

This invention relates to silicone encapsulated electronic circuit device packages.

BACKGROUND OF THE INVENTION

The development of integrated circuit technology from small scale integration to very large scale integration as well as the development of various hybrid integrated circuit packages has had great technological and economic impact on the U.S. electronics industry. The various individual integrated circuits as well as other components such as capacitors, resistors and the like are generally packaged in a circuit pack assembly. The circuit pack assemblies are protected from moisture and other contaminants by encapsulating them with a protective polymeric encapsulant material. One often used type of encapsulant is a silicone encapsulant, such as an RTV (room temperature vulcanized) silicone encapsulant. Circuit pack assemblies known as single-in-line packaging, dual-in-line packaging and hybrid integrated circuit packages are typical circuit pack assemblies which may be found to be encapsulated in such a protective polymeric material.

One problem that arises during the manufacture of circuit pack assemblies is that small metal particles which are formed when excess lengths of circuit leads which extend from the circuit packs are clipped after insertion into a printed wiring board. These metal pieces tend to stick to silicone encapsulated assemblies resulting in various quality control problems. We have found that static charge on the surface of the silicone encapsulant polymer as well as some tackiness of the surface have been the major causes of the problem. It has now been discovered that by the addition of a simple step subsequent to encapsulation and prior to insertion in the substrate and clipping of the leads one can substantially eliminate the tackiness and static charge problems.

SUMMARY OF THE INVENTION

In an electronic device assembly comprising at least one circuit element and an encapsulant therefor, wherein the encapsulant comprises a silicone resin characterized in that subsequent to the curing of said encapsulant, the resin is coated with a fine inorganic powder such as fumed or fused silica which essentially eliminates static charge and tackiness of the surface.

DETAILED DESCRIPTION

Figure 1:
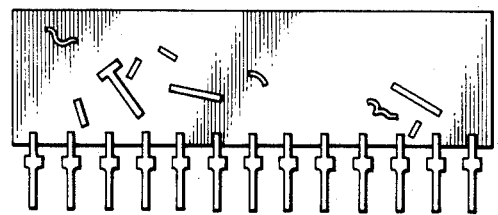
FIG. 1 is a photograph of a single-in-line package (SIP) circuit device which does not include the novel powder coating on the surface of the encapsulant.

Polymeric silicones are organic silicone compounds which have been polymerized. It has long been known in the semiconductor art that electronic semiconductor devices may be protected from environmental contamination by encapsulating these devices. Polymeric silicones have been a preferred encapsulant. In certain applications, such as in the manufacture of in-line package, wherein a circuit pack device is encapsulated with a silicone resin and the device is inserted into a substrate, e.g., a printed wiring board, to form a circuit pack assembly, excess lengths of conductive leads which extend from the circuit pack assembly are cut to proper size. It has been found that the metal clippings formed from cutting or trimming the leads are attracted to and stick to the surface of the silicone encapsulant due to a static charge thereon and sometimes additionally due to a tackiness of the surface. These loose metallic pieces must be cleaned and removed from the surface of the circuit pack assembly prior to use, otherwise they may inadvertently fall, causing a short between adjacent leads. In the past, such removal has been accomplished by brushing the particles from the surface of the circuit pack assembly. However, this is a tedious task and due to the static attraction, a difficult one. A simple solution to the problem has now been discovered.

More particularly, we have discovered that by coating the circuit pack assembly having a cured encapsulant thereon with a fine inorganic powder such as fumed or fused silica, the static charge as well as any tackiness thereon can be eliminated so that the lead clippings no longer adhere to the surface of the assembly. In addition to fused silica, one may use any fine inorganic powder such as talc or titanium dioxide, which essentially eliminates the static charge and tackiness of the surface. In addition to finding that this surface treatment eliminated the aforesaid problem, we surprisingly found that the surface treatment remains intact during subsequent processing of the circuit pack prior to trimming the leads. For example, generally, the circuit pack devices are inserted into a printed wiring board which is then immersion cleaned and wave soldered before the excess lead length is clipped. One would normally believe that the powder coating, which is preferably dusted onto the surface prior to insertion of the circuit pack device into the printed wiring board, would be removed during the steps of immersion cleaning and soldering. However, surprisingly, the powder coating remains intact.

Without the powder coating, as the leads are clipped the clippings tend to fly over and stick to the RTV silicone encapsulant. As the static charge which holds the clippings to the encapsulant dissipates, these clippings fall down onto the circuit board and may cause shorts in the circuit. However, as indicated, the presence of the inorganic powder coating, as taught herein, eliminates the static charge and hence the sticking problem and the lead clippings do not stick to the surface of the package.

Figure 2:
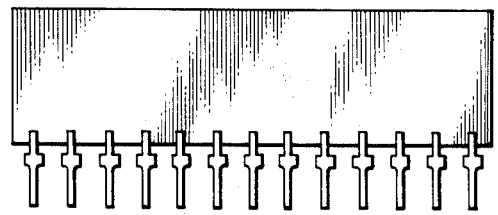
FIG. 2 is a similar single-in-line package device having a coating of a fine inorganic powder thereon.

One simple way of applying the fine inorganic powder to the circuit pack is simply by blowing it over the surface of the circuit pack. Excess powder can then be collected and reused. Referring to FIG. 1, there is shown a circuit pack assembly which had been inserted into a printed wiring board and had its leads clipped subsequent to a soldering operation. As can be seen, the surface of this circuit pack is coated with clippings. In contrast thereto, FIG. 2 shows a similar circuit pack which had a fumed silica powder coating applied thereto prior to insertion in the printed wiring board. As can be seen, there are no clippings adhering to this circuit pack.

Preferred inorganic powders suitable for eliminating static charge and tackiness of the encapsulant surface are fused silica and fumed silica powders.

Typically the powders are in a particle size range of from 0.007 μm to 0.014 μm. However, while fine particle sizes are preferred, the particle size is not critical.

What is claimed is:

1. An electronic circuit pack assembly comprising at least one circuit element having a cured silicone resin encapsulant thereover said circuit element having conductive leads extending from said circuit element into through-holes provided in a printed circuit board characterized by an inorganic powder applied on the surface of said cured resin which powder substantially eliminates static charge and tackiness of the resin surface.

2. The electronic circuit pack assembly recited in claim 1 wherein the organic powder is selected from the group consisting of talc, titanium dioxide and silicon dioxide.

3. The electronic circuit pack assembly recited in claim 1 wherein the organic powder is selected from the group consisting of fused and fumed silica.

4. The electronic circuit pack assembly recited in claim 1 wherein the powder has a mean particle size of from 0.007 μm to 0.014 μm.

5. The electronic circuit pack assembly recited in claim 3 wherein the mean particle size of the powder is from 0.007 μm to 0.014 μm.

6. The electronic circuit pack assembly recited in claim 1 wherein the resin is of the room temperature vulcanized type.

* * * * *